United States Patent [19]
Kim

[11] Patent Number: 6,100,764
[45] Date of Patent: Aug. 8, 2000

[54] REMOTE CONTROL PREAMP CIRCUIT

[75] Inventor: Byeong-Il Kim, Bucheon, Rep. of Korea

[73] Assignee: Samsung Electronics Co., Ltd., Rep. of Korea

[21] Appl. No.: 09/224,831

[22] Filed: Jan. 4, 1999

[30] Foreign Application Priority Data

Feb. 19, 1998 [KR] Rep. of Korea ............... 98-5144

[51] Int. Cl.[7] ............................................. H03F 3/08
[52] U.S. Cl. .................... 330/308; 330/301; 250/214 A
[58] Field of Search ................................ 330/308, 301, 330/59; 359/189; 250/214 A

[56] References Cited

U.S. PATENT DOCUMENTS 4,163,950   8/1979   Damm et al. ........................... 330/252

FOREIGN PATENT DOCUMENTS

| | | | |
|---|---|---|---|
| 62-102610 | 5/1987 | Japan | 330/308 |
| 2-196504 | 8/1990 | Japan | 330/308 |
| 3-165609 | 7/1991 | Japan | 330/308 |
| 94-25145 | 9/1994 | Rep. of Korea . | |

*Primary Examiner*—Robert Pascal
*Assistant Examiner*—Henry Choe
*Attorney, Agent, or Firm*—Samuels, Gauthier & Stevens LLP

[57] ABSTRACT

A pre-amp circuit including a photodiode, first and second amplifiers and a differential amplifier reduces or eliminates noise in an input signal. The photodiode converts an external optical signal into an electrical signal which includes noise. The first amplifier amplifies the difference between an output voltage of the photodiode, including the noise, and the reference voltage, to generate a difference signal which includes a first noise component. The second amplifier buffers the reference voltage to generate a signal which includes a second noise component which is in-phase with the first noise component. The differential amplifier amplifies the difference between the voltages output from the first and second amplifiers to generate an output signal which is substantially devoid of such noise. The present invention is amenable to application in remote control receiver systems.

25 Claims, 3 Drawing Sheets

REMOTE CONTROL PREAMP CIRCUIT

BACKGROUND OF THE INVENTION

In a remote control system, signals encoded as infrared rays are used to remotely direct system functions. A remote control transmitter generates control signals, and encodes them as infrared rays which are transmitted to a remote control receiver. The receiver receives the infrared rays and controls a system using the encoded signal information.

FIG. 1 is a circuit diagram of a conventional remote control preamp circuit. The conventional preamp circuit 10 includes a photodiode 11, a differential amplifier 21, resistors 31, 32 and 33 and a capacitor 41.

An anode of the photodiode 11 is grounded, and a cathode thereof is connected to a non-inverting (+) input of the differential amplifier 21. The photodiode 11 receives an infrared ray 12 from an external source and converts the input infrared ray 12 into current which is supplied to the non-inverting (+) input of the differential amplifier 21.

Resistor 31 is likewise connected to the non-inverting (+) input of the differential amplifier 21. A reference voltage (Vref) is applied to the non-inverting (+) input via resistor 31, together with the output of the photodiode 11.

Resistor 32 provides a feedback path between the output Vo terminal and inverting input (−) terminal of the differential amplifier 21. Resistor 32 is connected directly between the terminals, and resistor 33 and capacitor 41 are coupled in series between the inverting input (−) and ground GND.

External noise may enter the non-inverting (+) and inverting (−) inputs of the differential amplifier 21. The difference between the voltages of the noise applied to the non-inverting (+) and inverting (−) inputs is amplified by the differential amplifier 21, and the amplified noise is included in the output signal Vo. Thus, even where the input noise is weak, powerful noise is generated as it is amplified by the differential amplifier 21, which can cause a system, for example a remote control system, to malfunction.

SUMMARY OF THE INVENTION

The present invention relates to a preamp circuit and method, and more particularly, to a preamp circuit and method adaptable for use in a remote control for mitigating the effects of external noise in a manner which overcomes the limitations of conventional embodiments.

Accordingly, the apparatus of the present invention is directed to a pre-amp circuit including a photodiode, first and second amplifiers, and a differential amplifier.

The present invention includes a pre-amp circuit for eliminating noise in an amplified output signal generated from a received input signal including such noise. The circuit includes a photodiode, a first feedback amplifier, a second feedback amplifier, and a differential amplifier. The photodiode converts an externally-generated optical signal into an electrical signal, the electrical signal including a noise signal. The first feedback amplifier includes an inverting input connected to the output of the photodiode and a non-inverting input to which a reference voltage is applied for amplifying the difference between the voltage of the electrical signal and the reference voltage, and for generating a difference signal which includes a first noise component. The second feedback amplifier includes a non-inverting input to which the reference voltage is applied for buffering the reference voltage. The buffered reference voltage includes a second noise component which is substantially in-phase with the first noise component. The differential amplifier generates an output signal by amplifying the difference between the voltage of the difference signal and the buffered reference voltage, thereby eliminating said noise from the output signal.

In a preferred embodiment, the externally-generated optical signal comprises an infrared signal. The first and second feedback amplifiers preferably further comprise a resistor connected between the inverting input of the operational amplifier and the output of the operational amplifier.

The differential amplifier preferably comprises a first transistor having a control electrode which is connected to the output of the first amplifier for receiving the difference signal. A first resistor is connected between a first electrode of the first transistor and a power supply voltage for applying a voltage lower than the power supply voltage thereto. A second transistor has a control electrode connected to the output of the second amplifier for receiving the buffered reference signal. A second resistor is connected between a first electrode of the second transistor and the power supply voltage, for a applying a voltage lower than the power supply voltage thereto. A third transistor has a first electrode connected to the second electrodes of both the first and second transistors and further includes a control electrode connected to a control signal for activating the differential amplifier. A third resistor is connected between the second electrode of the third transistor at a ground port for raising the second electrode of the third transistor to a predetermined voltage. The transistors preferably comprise NPN transistors.

In a preferred embodiment, a fourth resistor is connected between the second electrode of the first transistor and the first electrode of the third transistor, and a fifth resistor is connected between the second electrode of the second transistor and a first electrode of the third transistor, the fourth and fifth resistors preventing overcurrent from flowing through the third transistor.

In this manner, an output signal is generated which is substantially devoid of said noise.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
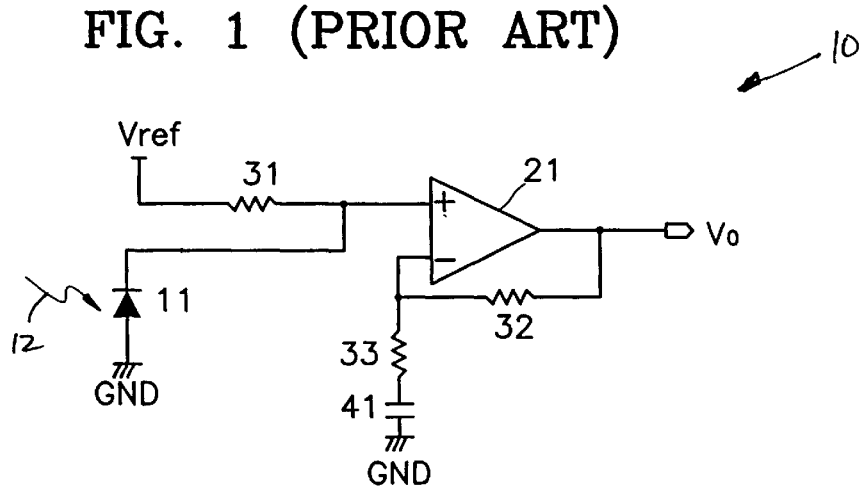
FIG. 1 is a schematic circuit diagram of a conventional remote control preamp circuit.
Figure 2:
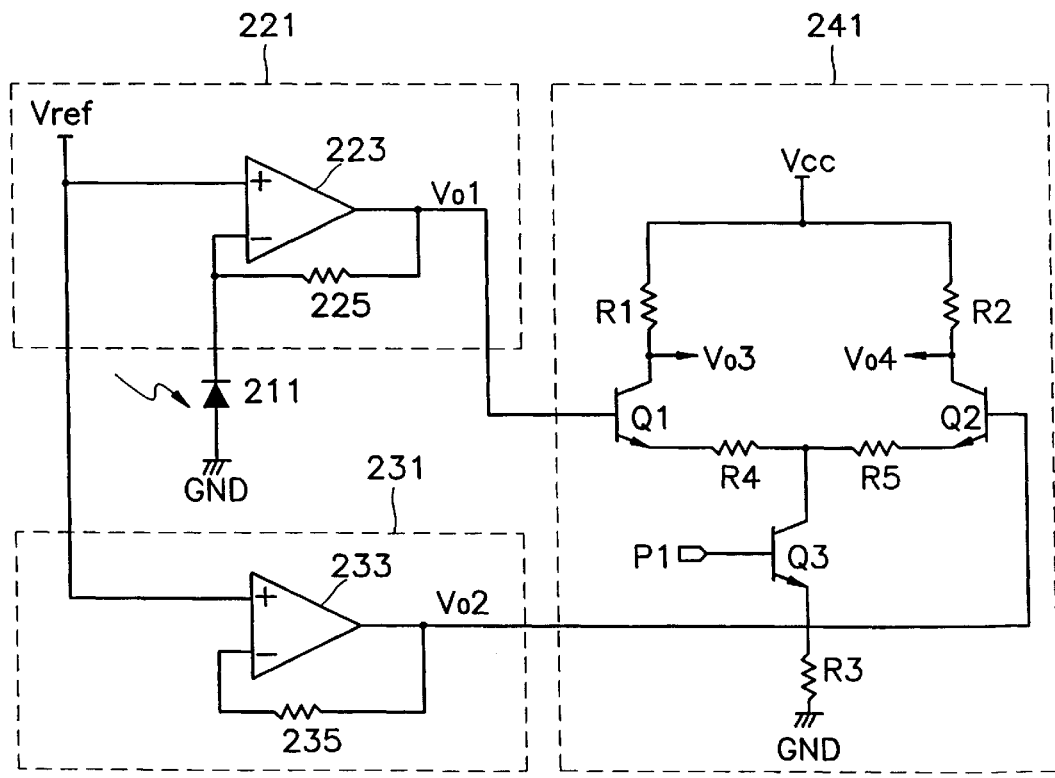
FIG. 2 is a schematic circuit diagram of a remote control preamp circuit according to the present invention.

With reference to FIG. 2, a remote control pre-amp circuit according to a preferred embodiment of the present invention comprises a photodiode 211, first and second amplifiers 221, 231 and a differential amplifier 241.

The anode of the photodiode 211 is grounded and the cathode is connected to an inverting (−) input of the first amplifier 221. The photodiode 211 converts an externally-generated optical signal, e.g., infrared rays, into an electric signal.

The first amplifier 221 includes a first operational amplifier 223 and a first feedback resistor 225. The output of the photodiode 211 is applied to the inverting (−) input of the first operational amplifier 223, and a reference voltage Vref is applied to the non-inverting (+) input of the first operational amplifier 223. The first feedback resistor 225 is connected between the inverting (−) input and the output of the operational amplifier 223. The first amplifier 221 amplifies the difference between the output voltage of the photodiode 211 and the reference voltage Vref. An amplified voltage Vo1 is transferred to the differential amplifier 241.

The second amplifier 231 includes a second operational amplifier 233 and a second feedback resistor 235. The reference voltage Vref is applied to the non-inverting (+) input of the second operational amplifier 233. The second feedback resistor 235 is connected between the inverting (−) input and the output of the second operational amplifier 233. The second amplifier 231 serves to buffer the reference voltage Vref. A buffered voltage Vo2 is transferred to the differential amplifier 241.

The differential amplifier 241 includes first, second, and third NPN transistors Q1, Q2, Q3, and first through fifth resistors R1–R5.

A base, a collector and an emitter of the first NPN transistor Q1 are connected to the output of the first amplifier 221, the first resistor R1 and the fourth resistor R4, respectively, as shown. When the voltage Vo1 of the output of the first amplifier 221 is greater than a voltage applied to the emitter of the first NPN transistor Q1, by a predetermined voltage (about 0.7V for a silicon transistor or about 0.3V for a germanium transistor), the first NPN transistor Q1 becomes active.

A base, a collector and an emitter of the second NPN transistor Q2 are connected to the output of the second amplifier 231, the second resistor R2 and the fifth resistor R5, respectively, as shown. When the voltage Vo2 of the output of the second amplifier 231 is greater than a voltage applied to the emitter of the second NPN transistor Q2, by a predetermined voltage (about 0.7V for a silicon transistor or about 0.3V for a germanium transistor), the second NPN transistor Q2 becomes active.

A base of the third NPN transistor Q3 is connected to a control signal P1, a collector thereof is connected to both the fourth and fifth resistors R4 and R5, and an emitter thereof is grounded via the third resistor R3. When the control signal P1 is greater than a voltage applied to the emitter of the third NPN transistor Q3, by a predetermined voltage (about 0.7V for a silicon transistor or about 0.3V for a germanium transistor), the third NPN transistor Q3 is activated. Activation of the third NPN transistor Q3 in turn activates the differential amplifier 241.

The first resistor R1 is connected between a power supply voltage Vcc and the collector of the first NPN transistor Q1, and the second resistor R2 is connected between the power supply voltage Vcc and the collector of the second NPN transistor Q2. The first and second resistors R1 and R2 reduce the power supply voltage Vcc, and the reduced power supply voltage is applied to the collectors of the first and second NPN transistors Q1 and Q2.

The third resistor R3 is connected between the emitter of the third NPN transistor Q3 and the ground port (GND). A voltage drop occurs as current flows from the emitter of the third NPN transistor Q3 to the ground port (GND), raising the emitter of the third NPN transistor Q3 to a predetermined voltage.

The fourth resistor R4 is connected between the emitter of the first NPN transistor Q1 and the collector of the third NPN transistor Q3, and the fifth resistor R5 is connected between the emitter of the second NPN transistor Q2 and the collector of the third NPN transistor Q3. In the fourth resistor R4, a voltage drop occurs as current flows from the emitter of the first NPN transistor Q1, to prevent overcurrent from flowing through the third NPN transistor Q3. In the fifth resistor R5, a voltage drop occurs as current flows from the emitter of the second NPN transistor Q2, to prevent overcurrent from flowing through the third NPN transistor Q3.

The operation of the differential amplifier 241 will now be described. Assuming the third NPN transistor Q3 is activated by signal P1, if voltage Vo1, applied to the base of the first NPN transistor Q1, is greater than voltage Vo2, applied to the base of the second NPN transistor Q2, then the current flowing through the first NPN transistor Q1 is significantly greater than the current flowing through the second NPN transistor Q2, such that a voltage Vo3 at the collector of the first NPN transistor Q1 is lowered to nearly a ground voltage. On the contrary, if voltage Vo1 is smaller than voltage Vo2, then the current flowing through the first NPN transistor Q1 is significantly smaller than the current flowing through the second NPN transistor Q2, such that the voltage Vo3 at the collector of the first NPN transistor Q1 is raised to nearly the power supply voltage Vcc.

The voltage Vo4 at the collector of the second NPN transistor Q2 is generally opposite the voltage Vo3 at the collector of the first NPN transistor Q1. That is, when the voltage Vo3 approaches the power supply voltage Vcc, the voltage Vo4 becomes nearly the ground voltage. When the voltage Vo3 approaches the ground voltage, the voltage Vo4 of the collector of the second NPN transistor Q2 becomes nearly the power supply voltage Vcc.

Figure 3:
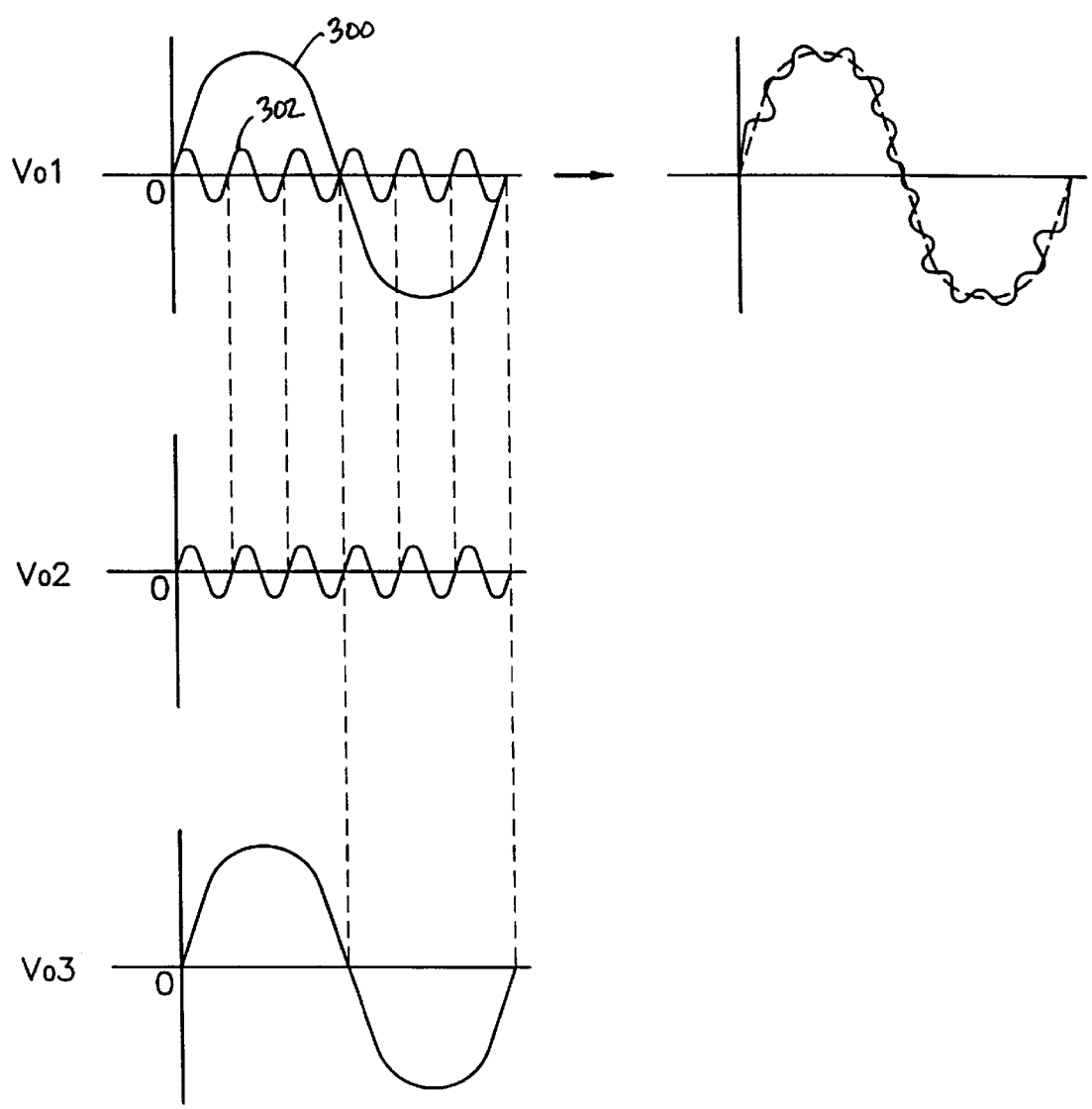
FIG. 3 illustrates waveforms of input and output signals when external noise is applied to the inputs of the first and second amplifiers shown in FIG. 2.

FIG. 3 illustrates the behaviour of waveforms of input and output signals when external noise is included in the input signals provided to the first and second amplifiers 221 and 231 for voltages Vo1, Vo2, and Vo3. When such noise is generated, the differential amplifier 241 operates to remove all noise and amplifies only the signal output from the photodiode 211.

The operation of the pre-amp circuit shown in FIG. 2 will now be described with reference to FIG. 3. When external noise 302 enters the input port of the first amplifier 221, it is combined with the signal output 300 of the photodiode 211, and the result is applied to the inverting (−) input of the first amplifier 221. That is, the signal 300 applied to the input port of the first amplifier 221 in effect has a distorted waveform. When noise 302 enters the input port of the first amplifier 221, noise having the same phase also enters the input port of the second amplifier 231. The phase of the noise at the output of the first amplifier 221 is therefore the same as that of the noise at the output of the second amplifier 231. The in-phase noise signals are applied to the first and second NPN transistors Q1, Q2, which, as described above operate with opposite collector voltages. This, in turn, causes a cancellation of the noise signal in the differential amplifier 241 and thus, the differential amplifier 241 amplifies only the signal output from the photodiode 211 and generates an output signal Vo3, Vo4 which is substantially free of noise.

In a preferred embodiment, Vref comprises 2.5 volts; resistor 225 comprises 100K ohms; resistor 235 comprises 100K ohms; resistors R1, R2, R3, R4 and R5 comprise 1K, 1K, 1K, 1K, and 2K ohms respectively; Q1 and Q2 comprise NPN transistors; Vcc comprises 5 volts; and P1 comprise 1.0 volts. Other resistance and voltage values may be employed, and are equally applicable, depending on the type of operational amplifiers 233, 2335 and transistors Q1, Q2, Q3 used, and depending on the application.

Figure 4:
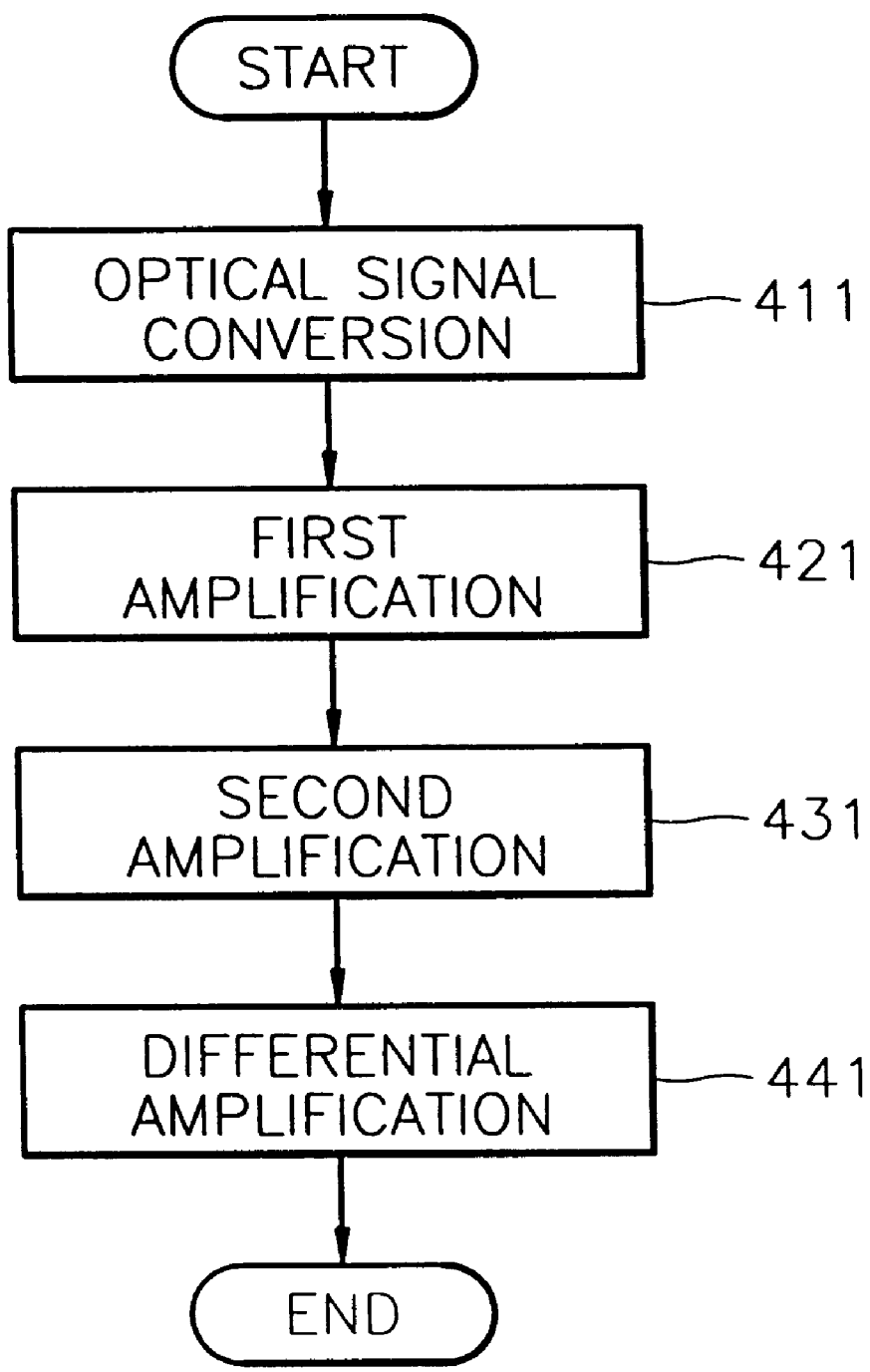
FIG. 4 is a flow diagram of a pre-amplification method in the pre-amp circuit according to the present invention.

FIG. 4 is a flow diagram illustrating a pre-amplification method in the pre-amp circuit according to the present invention. Referring to FIG. 4, the pre-amplification method is comprised of an optical signal conversion step 411, first and second amplifying steps 421 and 431, and a differential amplifying step 441.

In step 411, the photodiode 211 receives an external optical signal and converts the optical signal into an electrical signal. The optical signal may comprise, for example an infrared signal.

In step 421, the electrical signal generated in step 411 is amplified along with any accompanying noise in the first amplifier 221.

In step 431, the noise is likewise applied to a second amplifier 231.

In step 441, when the phase of the noise amplified in step 421 is the same as that of the noise amplified in step 431, the noise is removed by the differential amplifier 241, and only the electrical signal amplified in step 421 is amplified and output.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A pre-amp circuit for eliminating noise in an amplified output signal generated from a received input signal including such noise comprising:

a photodiode for converting an externally generated optical signal into an electrical signal, said electrical signal including a noise signal;

a first amplifier having an inverting input connected to the output of the photodiode and having a non-inverting input to which a reference voltage is applied, the non-inverting input being isolated from the photodiode, for amplifying the difference between the voltage of the electrical signal and the reference voltage, and for generating a difference signal which includes a first noise component;

a second amplifier having a non-inverting input to which the reference voltage is applied for buffering the reference voltage, said buffered reference voltage including a second noise component substantially in-phase with said first noise component; and a differential amplifier, for generating an output signal by amplifying the difference between the voltage of the difference signal and the buffered reference voltage, thereby eliminating said noise from the output signal.

2. The pre-amp circuit as claimed in claim 1, wherein the externally-generated optical signal is an infrared signal.

3. The pre-amp circuit as claimed in claim 1, wherein the first amplifier further comprises a resistor connected between the inverting input of an operational amplifier and the output of the operational amplifier.

4. The pre-amp circuit as claimed in claim 1, wherein the second amplifier further comprises a resistor connected between the inverting input of an operational amplifier and the output of the operational amplifier.

5. The pre-amp circuit as claimed in claim 1, wherein the differential amplifier comprises:

a first transistor having control electrode connected to the output of the first amplifier for receiving the difference signal;

a first resistor connected between a first electrode of the first transistor and a power supply voltage, for applying a voltage lower than the power supply voltage thereto;

a second transistor having a control electrode connected to the output of the second amplifier for receiving the buffered reference signal;

a second resistor connected between a first electrode of the second transistor and the power supply voltage, for applying a voltage lower than the power supply voltage thereto;

a third transistor having a first electrode connected to the second electrodes of both the first and second transistors and having a control electrode connected to a control signal for activating the differential amplifier; and a third resistor connected between the second electrode of the third transistor and a ground port, for raising the second electrode of the third transistor to a predetermined voltage.

6. The pre-amp circuit as claimed in claim 5, wherein the first transistor is an NPN transistor having a base connected to the output of the first amplifier, a collector connected to the first resistor, and an emitter connected to the second electrode of the second transistor.

7. The pre-amp circuit as claimed in claim 5, wherein the second transistor is an NPN transistor having a base connected to the output of the second amplifier, a collector connected to the second resistor, and an emitter connected to the second electrode of the first transistor.

8. The pre-amp circuit as claimed in claim 5, wherein the third transistor is an NPN transistor having a collector connected to the second electrodes of the first transistor and the second transistor, a base connected to the control signal, and an emitter connected to the third resistor.

9. The pre-amp circuit as claimed in claim 5, further comprising:

a fourth resistor connected between the second electrode of the first transistor and the first electrode of the third transistor; and a fifth resistor connected between the second electrode of the second transistor and the first electrode of the third transistor, the fourth and fifth resistors preventing overcurrent from flowing through the third transistor.

10. A method for eliminating noise in an amplified output signal generated from a received input signal including such noise comprising:

converting an externally-generated received optical input signal into an electrical input signal, said electrical signal including a noise signal;

amplifying the difference between the voltage of the electrical input signal and a reference voltage electrically isolated from the electrical input signal at a first amplifier, thereby generating a difference signal which includes a first noise component;

buffering the reference voltage at a second amplifier, said buffered reference voltage including a second noise component substantially in-phase with said first noise component; and applying the difference signal and the buffered reference voltage to a differential amplifier, thereby eliminating said noise from the output signal.

11. A pre-amp circuit for eliminating noise in an amplified output signal generated from a received input signal including such noise comprising:

a photodiode for converting an externally generated non-differential optical signal into an electrical signal, said electrical signal including a noise signal;

a first amplifier having an inverting input connected to the output of the photodiode and having a non-inverting input to which a reference voltage is applied, for amplifying the difference between the voltage of the electrical signal and the reference voltage, and for generating a difference signal which includes a first noise component;

a second amplifier having a non-inverting input to which the reference voltage is applied for buffering the reference voltage, said buffered reference voltage including a second noise component substantially in-phase with said first noise component; and a differential amplifier, for generating an output signal by amplifying the difference between the voltage of the difference signal and the buffered reference voltage, thereby eliminating said noise from the output signal.

12. The pre-amp circuit as claimed in claim 11, wherein the externally-generated optical signal is an infrared signal.

13. The pre-amp circuit as claimed in claim 11, wherein the first amplifier further comprises a resistor connected between the inverting input of an operational amplifier and the output of the operational amplifier.

14. The pre-amp circuit as claimed in claim 11, wherein the second amplifier further comprises a resistor connected between the inverting input of an operational amplifier and the output of the operational amplifier.

15. The pre-amp circuit as claimed in claim 11, wherein the differential amplifier comprises:

a first transistor having control electrode connected to the output of the first amplifier for receiving the difference signal;

a first resistor connected between a first electrode of the first transistor and a power supply voltage, for applying a voltage lower than the power supply voltage thereto;

a second transistor having a control electrode connected to the output of the second amplifier for receiving the buffered reference signal;

a second resistor connected between a first electrode of the second transistor and the power supply voltage, for applying a voltage lower than the power supply voltage thereto;

a third transistor having a first electrode connected to the second electrodes of both the first and second transistors and having a control electrode connected to a control signal for activating the differential amplifier; and a third resistor connected between the second electrode of the third transistor and a ground port, for raising the second electrode of the third transistor to a predetermined voltage.

16. The pre-amp circuit as claimed in claim 15, wherein the first transistor is an NPN transistor having a base connected to the output of the first amplifier, a collector connected to the first resistor, and an emitter connected to the second electrode of the second transistor.

17. The pre-amp circuit as claimed in claim 15, wherein the second transistor is an NPN transistor having a base connected to the output of the second amplifier, a collector connected to the second resistor, and an emitter connected to the second electrode of the first transistor.

18. The pre-amp circuit as claimed in claim 15, wherein the third transistor is an NPN transistor having a collector connected to the second electrodes of the first transistor and the second transistor, a base connected to the control signal, and an emitter connected to the third resistor.

19. The pre-amp circuit as claimed in claim 15, further comprising:

a fourth resistor connected between the second electrode of the first transistor and the first electrode of the third transistor; and a fifth resistor connected between the second electrode of the second transistor and the first electrode of the third transistor, the fourth and fifth resistors preventing overcurrent from flowing through the third transistor.

20. A method for eliminating noise in an amplified output signal generated from a received input signal including such noise comprising:

converting an externally-generated received non-differential optical input signal into an electrical input signal, said electrical signal including a noise signal;

amplifying the difference between the voltage of the electrical input signal and a reference voltage at a first amplifier, thereby generating a difference signal which includes a first noise component;

buffering the reference voltage at a second amplifier, said buffered reference voltage including a second noise component substantially in-phase with said first noise component; and applying the difference signal and the buffered reference voltage to a differential amplifier, thereby eliminating said noise from the output signal.

21. A pre-amp circuit for eliminating noise in an amplified output signal generated from a received input signal including such noise comprising:

a photodiode for converting an externally generated optical signal into an electrical signal, said electrical signal including a noise signal;

a first amplifier having an inverting input connected to the output of the photodiode and having a non-inverting input to which a reference voltage is applied, for amplifying the difference between the voltage of the electrical signal and the reference voltage, and for generating a difference signal which includes a first noise component;

a second amplifier having a non-inverting input to which the reference voltage is applied for buffering the reference voltage, said buffered reference voltage including a second noise component substantially in-phase with said first noise component; and a differential amplifier, for generating an output signal by amplifying the difference between the voltage of the difference signal and the buffered reference voltage, thereby eliminating said noise from the output signal; wherein the differential amplifier comprises:

a first transistor having control electrode connected to the output of the first amplifier for receiving the difference signal;

a first resistor connected between a first electrode of the first transistor and a power supply voltage, for applying a voltage lower than the power supply voltage thereto;

a second transistor having a control electrode connected to the output of the second amplifier for receiving the buffered reference signal;

a second resistor connected between a first electrode of the second transistor and the power supply voltage, for applying a voltage lower than the power supply voltage thereto;

a third transistor having a first electrode connected to the second electrodes of both the first and second transistors and having a control electrode connected to a control signal for activating the differential amplifier; and a third resistor connected between the second electrode of the third transistor and a ground port, for raising the second electrode of the third transistor to a predetermined voltage.

22. The pre-amp circuit as claimed in claim 21, wherein the first transistor is an NPN transistor having a base connected to the output of the first amplifier, a collector connected to the first resistor, and an emitter connected to the second electrode of the second transistor.

23. The pre-amp circuit as claimed in claim 21, wherein the second transistor is an NPN transistor having a base connected to the output of the second amplifier, a collector connected to the second resistor, and an emitter connected to the second electrode of the first transistor.

24. The pre-amp circuit as claimed in claim 21, wherein the third transistor is an NPN transistor having a collector connected to the second electrodes of the first transistor and the second transistor, a base connected to the control signal, and an emitter connected to the third resistor.

25. The pre-amp circuit as claimed in claim 21, further comprising:

a fourth resistor connected between the second electrode of the first transistor and the first electrode of the third transistor; and a fifth resistor connected between the second electrode of the second transistor and the first electrode of the third transistor, the fourth and fifth resistors preventing overcurrent from flowing through the third transistor.

* * * * *